(12) United States Patent
Mazula

(10) Patent No.: US 10,049,479 B2
(45) Date of Patent: Aug. 14, 2018

(54) DENSITY BASED GRAPHICAL MAPPING

(71) Applicant: Dassault Systemes, Velizy Villacoublay (FR)

(72) Inventor: Nelia Gloria Mazula, Houston, TX (US)

(73) Assignee: Dassault Systemes, Velizy Villacoublay (FR)

( * ) Notice: Subject to any disclaimer, the term of this patent is extended or adjusted under 35 U.S.C. 154(b) by 153 days.

(21) Appl. No.: 14/983,878

(22) Filed: Dec. 30, 2015

(65) Prior Publication Data

US 2017/0193696 A1 Jul. 6, 2017

(51) Int. Cl.
| | |
|---|---|
| *G06T 17/00* | (2006.01) |
| *G06T 11/60* | (2006.01) |
| *G06F 17/50* | (2006.01) |
| *G06K 9/00* | (2006.01) |

(52) U.S. Cl.
CPC .............. *G06T 11/60* (2013.01); *G06F 17/50* (2013.01); *G06K 9/00476* (2013.01); *G06K 9/00483* (2013.01)

(58) Field of Classification Search
None
See application file for complete search history.

(56) References Cited

U.S. PATENT DOCUMENTS

| | | | |
|---|---|---|---|
| 2004/0249809 A1 | 12/2004 | Ramani et al. | |
| 2006/0067573 A1 | 3/2006 | Parr et al. | |
| 2009/0222446 A1 | 9/2009 | Goldschmidt et al. | |
| 2010/0046704 A1 | 2/2010 | Song et al. | |
| 2011/0015901 A1 | 1/2011 | Winterberg et al. | |
| 2011/0064282 A1 | 3/2011 | Abramovich et al. | |
| 2011/0129124 A1 | 6/2011 | Givon | |
| 2012/0170821 A1 | 7/2012 | Zug et al. | |
| 2013/0185024 A1 | 7/2013 | Mahasenan et al. | |

(Continued)

FOREIGN PATENT DOCUMENTS

| | | |
|---|---|---|
| EP | 2892028 A2 | 7/2015 |
| EP | 2892028 A3 | 11/2015 |

(Continued)

OTHER PUBLICATIONS

Autodesk, "Cloud Services," http://www.autodesk.com/360-cloud, 2014.*

(Continued)

*Primary Examiner* — Nicholas R Wilson
(74) *Attorney, Agent, or Firm* — Hamilton, Brook, Smith & Reynolds, P.C.

(57) ABSTRACT

An embodiment of the present invention provides a method of updating a CAD model representing an environment. Such an embodiment begins by generating a point cloud representing one or more objects of an environment based on received signals, where the received signals reflected off the one or more objects of the environment. Next, one or more clusters of the point cloud are identified based on a density of points that includes the one or more clusters. In turn, the one or more clusters are mapped to existing CAD diagrams and a CAD model of the environment is automatically updated using the existing CAD diagrams.

20 Claims, 8 Drawing Sheets

(56) References Cited

U.S. PATENT DOCUMENTS

| | | | |
|---|---|---|---|
| 2014/0210856 A1* | 7/2014 | Finn | G01C 15/002 345/633 |
| 2014/0350395 A1 | 11/2014 | Shachaf et al. | |
| 2015/0002639 A1 | 1/2015 | Kwon et al. | |
| 2015/0197016 A1 | 7/2015 | Krenik | |
| 2015/0213059 A1 | 7/2015 | Ely | |
| 2015/0279087 A1 | 10/2015 | Myers et al. | |
| 2015/0294511 A1 | 10/2015 | Nishioka et al. | |
| 2016/0047903 A1 | 2/2016 | Dussan | |
| 2017/0007368 A1 | 1/2017 | Boronkay | |
| 2017/0100088 A1 | 4/2017 | Simon | |
| 2017/0193132 A1 | 7/2017 | Mazula | |
| 2017/0193278 A1 | 7/2017 | Mazula | |

FOREIGN PATENT DOCUMENTS

| WO | WO 2006/097926 A2 | 9/2006 |
|---|---|---|
| WO | WO 2010/009840 A1 | 1/2010 |

OTHER PUBLICATIONS

Te Gao, "Constructing a Complete and Accurate As-Build BIM Based on an As-Designed BIM and Progressive Laser Scans," Carnegie Mellon University, 2014.*

Kim et al., "Automated construction progress measurement using a 4D building information model and 3D data," Department of Architectural Engineering, Republic of Korea, Dec. 2012.*

"Point Cloud," Wikipedia, May 19, 2015, Retrieved from https://en.wikipedia.org/wiki/Point_cloud on Apr. 6, 2016.

Non-Final Office Action for U.S. Appl. No. 14/984,412, "3D to 2D Reimaging for Search," dated Jun. 2, 2017.

Extended European Search Report for European Application No. 16207196.3 dated Jun. 8, 2017 entitled "Density Based Graphical Mapping".

Kris Demarsin, "Extraction of Closed Feature Lines from Point Clouds Based on Graph Theory", Retrieved from the Internet: URL:http://www.cs.kuleuven.be/publicaties/doctoraten/tw/TW2009_01.pdf, pp. 1-136, Jan. 1, 2009.

Son, H. et al., "Knowledge-Based Approach for 3D Reconstruction of As-Built Industrial Plant Models From Laser-Scan Data", 2013 Proceedings of the 30th International Symposium on Automation and Robotics in Construction, pp. 1-9, Aug. 11, 2013.

Blümel, Ina, et al., PROBADO3D—Indexing and Searching 3D CAD Databases: Supporting Planning through Content-Based Indexing and 3D Shape Retrieval, International Conference on Design & Decision Support Systems in Architecture and Urban Planning, pp. 1-7 (Jul. 22, 2010).

Extended European Search Report for European Application No. 16207197.1 dated May 10, 2017.

Extended European Search Report for European Application No. 16207198.9 dated May 11, 2017.

Funkhouser, Thomas, et al., "A Search Engine for 3D Models", ACM Transactions on Graphics, 22(1): 83-105 (Jan. 1, 2003).

Tangelder, Johan W. H. And Veltkamp, Remco C.,"A survey of content based 3D shape retrieval methods", Multimedia Tools and Applications, Kluwer Academic Publishers, 39(3): 441-471 (Dec. 8, 2007).

Final Office Action, U.S. Appl. No. 14/984,412, "3D to 2D Reimaging for Search," dated Dec. 12, 2017.

* cited by examiner

US 10,049,479 B2

DENSITY BASED GRAPHICAL MAPPING

RELATED APPLICATIONS

This application is related to "3D TO 2D REIMAGING FOR SEARCH" by Nelia Gloria Mazula, Ser. No. 14/984,412 and "EMBEDDED FREQUENCY BASED SEARCH AND 3D GRAPHICAL DATA PROCESSING" by Nelia Gloria Mazula, Ser. No. 14/984,765. The entire teachings of the above applications are incorporated herein by reference.

BACKGROUND

Embodiments generally relate to the field of computer programs and systems, and specifically to the field of computer aided design (CAD), computer-aided engineering, and modeling.

A number of systems and programs are offered on the market for the design of parts or assemblies of parts. These so called CAD systems allow a user to construct and manipulate complex three-dimensional models of object or assemblies of objects. CAD systems thus provide a representation of modeled objects using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects. For example, an assembly may contain thousands of parts. A CAD system can be used to manage models of objects, which are stored in electronic files.

SUMMARY OF THE INVENTION

CAD models while including a significant amount of data, have limited utility if they are inaccurate. Oftentimes, CAD models of objects are created, and used for example, in the construction of the object. However, objects and their environments are not static and frequently change. Thus, methodologies are needed to update CAD models to reflect these changes. Embodiments of the present invention provide such functionality. This functionality can be used in a variety of fields, including process facilities re-design, maintenance, and operations.

An embodiment of the present invention begins by generating a point cloud in computer memory, the point cloud representing one or more objects of an environment based on received signals, where the received signals have reflected off one or more real-world objects of an environment. After generating the point cloud, one or more clusters of the point cloud are identified, by a processor coupled to the computer memory, based on a density of points that includes the one or more clusters. In turn, the processor maps the one or more clusters to existing CAD diagrams. The existing CAD diagrams that map to the clusters are then used by the processor to automatically update a CAD model of the environment.

An embodiment of the method iterates the identifying, mapping, and updating so as to update sub-components of the one or more clusters. Yet another embodiment, stores the identified one or more clusters as respective libraries in computer memory. According to an embodiment, mapping the one or more clusters comprises flattening the one or more clusters to respective two-dimensional (2D) representations and comparing the respective 2D representations to existing 2D CAD diagrams to identify one or more matching existing 2D CAD diagrams.

In an embodiment, the received signals are at least one of sound signals and light signals. Yet another embodiment further comprises using the point cloud to update the CAD model of the environment to show spatial changes of the one or more real-world objects. Similarly, a further embodiment updates the CAD model of the environment to show mechanical changes to the one or more real-world objects using the point cloud. An alternative embodiment further identifies one or more materials of the one or more real-world objects using the point cloud.

Another embodiment of the present invention is directed to a system for updating a CAD model representing an environment. Such a system comprises an emitter configured to emit a signal at one or more objects of an environment and a receiver configured to receive signals reflecting off the one or more objects. Further, according to an embodiment, the system includes a digital processing module communicatively coupled to the receiver and comprising a computer memory and a processor communicatively coupled to the computer memory. In such an embodiment, the processor is configured to generate a point cloud representing the one or more objects of the environment using the received signals. Moreover, the processor is configured to identify one or more clusters of the point cloud based on a density of points that includes the one or more clusters, map the one or more clusters to existing CAD diagrams, and automatically update a CAD model of the environment using the existing CAD diagrams.

In yet another embodiment, the digital processing module is further configured to iterate the identifying, mapping, and updating to update sub-components of the one or more clusters. An alternative embodiment of the system comprises a database configured to store the identified one or more clusters as respective libraries in the computer memory. According to an embodiment, the digital processing module processor is configured to map the one or more clusters by flattening the one or more clusters to respective 2D representations and, in turn, comparing the respective 2D representations to existing 2D CAD diagrams to identify one or more matching existing 2D CAD diagrams.

In an example system embodiment, the emitter emits at least one of sound signals and light signals. According to yet another embodiment, the digital processing module processor is further configured to update the CAD model of the environment to show spatial changes of the one or more real-world objects using the point cloud. Another embodiment of the system comprises a digital processing module processor configured to update the CAD model of the environment to show mechanical changes of the one or more real-world objects using the point cloud. Further, in an embodiment, the digital processing module processor is configured to identify one or more materials of the one or more real-world objects using the point cloud.

Another embodiment of the present invention is directed to a cloud computing implementation for updating a CAD model representing an environment. Such an embodiment is directed to a computer program product executed by a server in communication across a network with one or more clients, where the computer program product comprises a computer readable medium. In such an embodiment, the computer readable medium comprises program instructions which, when executed by a processor, causes the processor to, based on received signals that have reflected off one or more real-world objects of an environment, generate a point cloud representing the one or more objects of the environment using the received signals. Further, in such an embodiment, the program instructions, when executed by the processor, further cause the processor to identify one or more clusters of the point cloud based upon density of points comprising the one or more clusters, map the one or more clusters to existing CAD diagrams, and automatically update the CAD model of the environment using the existing CAD diagrams.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
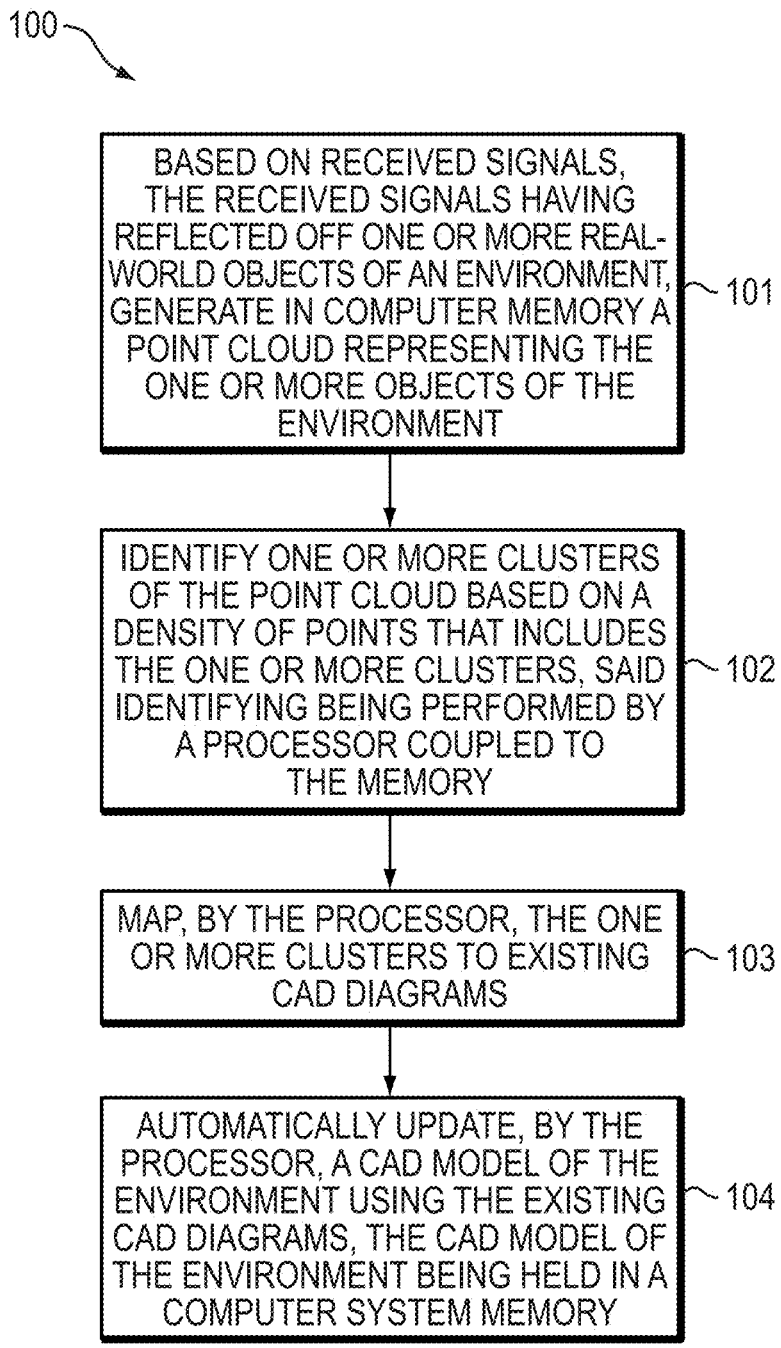
FIG. 1 is a flowchart of a method for updating a CAD model according to an embodiment.

A description of example embodiments of the invention follows.

The teachings of all patents, published applications and references cited herein are incorporated by reference in their entirety.

Embodiments of the present invention update CAD models. For instance, the principles of the present invention may be utilized to update or create CAD models of processing facilities, amongst other examples. Embodiments can greatly improve current methodologies used in facility/environment re-design, maintenance, and operations. Process and sub-sea (i.e., oil and gas) facilities, such as plants, production facilities, and refineries, are hard to reach and film visually. Further, these environments are complex and subject to changes from environmental impacts, such as waves, and water corrosion, plant modifications, and animal or human interaction with the mechanical facilities. These areas are located in areas (i.e., sub-sea and outer-space) that are often dark and further, the environments are densely designed making it hard to visually access and see all areas of these facilities.

Several problems arise in different industries that make it difficult to maintain accurate CAD models of environments. Often, because these facilities are very large, when minor modifications are done to the facilities, these minor modifications are only reflected in lower cost 2D CAD which is incompatible with the 3D CAD application that was used to design the facilities. Further, when changes are reflected in 3D CAD, they are often performed in a different 3D CAD program than the original CAD program used to design the facility. In such scenarios, the original 3D CAD is obsolete after a few changes have been performed. Further, while often being in hard to reach places, the facilities are frequently in severe environments that change the facility with unpredictable frequency. Example locations include, underwater, far from land, deep water, underground, and space.

This is further complicated because many organizations have a combination of different graphical images that have been collected and created over time which results in a complex repository of different 2D, 3D, and video file formats that are not easy to map. It would be desirable to map pictures taken of the facility plans to 3D drawings or subsea surveillance videos to 2D graphics or even pictures. Such a mapping allows one to understand the changes to the facilities. Without knowing about these changes, inefficiencies occur and even catastrophic problems can result from facility damage, poor design and configuration, or other related issues that could be optimized, mitigated, or prevented using embodiments of the present invention.

While methodologies like laser scan exist, laser scan does not offer interactive views of the facility. Further, for minor modifications laser scan does not offer a practical solution to provide interactive data on a facility/environment. Existing methods require re-engineering the point cloud into CAD models. Further, even in scenarios where the CAD is re-engineered, there is no existing solution that allows a user to look at several CAD or interactive CAD models or similar viewing methods such as smart videos, based on the laser scan. Due to scanned images only capturing visual information, these models do not intrinsically contain metadata about the objects within the model. Currently, identification is done manually or through simple mapping solutions that require a lot of human intervention. Embodiments of the invention self-learn to identify objects in environments using logic loops, iteration, and process of elimination.

FIG. 1 is a flow diagram of a method 100 for updating a CAD model representing an environment that can be used to overcome the foregoing difficulties that arise in maintaining and updating CAD models of complex environments. The method 100 begins at step 101 by generating a point cloud in computer memory representing one or more objects of the environment. In an alternative embodiment of the method 100, a polygon is constructed instead of the point cloud at step 101 and the polygon is used accordingly throughout the method 100. According to an embodiment, the point cloud is generated based on received signals that have reflected off one or more objects of an environment. Thus, in such an embodiment, signals are emitted at the environment of interest and these signals, in turn, reflect off the one or more objects of the environment and are received and processed at step 101 to generate a point cloud of the environment/objects therein. Consider the example of an oil processing facility. In such an example, sounds signals may be emitted at the facility, and these sounds signals would, in turn, reflect off the various objects making up the facility, such as pumps and pipeline portions. These reflected signals would then be received and processed at step 101 to form a point cloud of the oil processing facility. In an example embodiment of the method 100, the received signals are at least one of sound signals and light signals, amongst other examples. According to an embodiment, the point cloud generated at step 101 is composed of data points that are generated by 3D laser scanning devices that include one or more transmitter and one or more receiver. Laser scanning devices measure points having reflected from an objects surface in the real world. The data output of these devices is a point cloud file that includes 3D coordinate information for each point.

The method 100 continues at step 102 and identifies one or more clusters of the point cloud based on a density of points that includes the one or more clusters. In other words, at step 102 the point cloud generated at step 101 is analyzed and particular portions, i.e., clusters of the point cloud, are identified based upon a density of points in those portions. According to an embodiment of the method 100, the one or more clusters are identified based on a density collection of points that includes the one or more clusters of points representing an object. In an embodiment, clusters are identified based upon higher point density areas being surrounded by space (for example, low or no density areas due to space/air) or based upon other areas with different densities (for example, a fold, corner, or edge). In an embodiment, portions of the point cloud with similar densities are identified as belonging to respective objects and are considered as belonging to a respective cluster. For instance, a first portion of the point cloud may have points with a density of 100 points per square inch and an adjacent portion of the point cloud may have points with a density of 200 points per square inch. These portions, with different point densities, may be considered as belonging to respective clusters. In an embodiment, changes in point density may be used to identify the bounds of an object and/or respective clusters, e.g., when density changes those points may be considered a different cluster. Further, in an embodiment, the various objects of the environment may each be represented by a respective cluster identified at step 102. For example, in an embodiment of the method 100 used to re-engineer an oil processing plant, a first cluster of points with a particular density may be points that represent a pump and a second cluster of points with its own density may be points that represent a pipe connected to the pump. A density collection maybe used to describe a cluster that is an object or it may be used to differentiate between two objects, e.g., there should be a variation between two flanges connecting a valve to the adjoining pipe. Further detail regarding point cloud density and cluster identification is described herein below in relation to FIG. 6.

An embodiment of the method 100 may identify any number of clusters at step 102. Thus, an embodiment may identify for instance, a cluster for each object in an environment, or each object in a portion of an environment. In a computer implemented embodiment of the method 100, identifying the clusters at step 102 is performed by a processor coupled to the memory in which the point cloud at step 101 was generated. At step 102, an alternative embodiment of the method 100 may store the identified clusters as respective libraries in computer memory. Further detail regarding said storage, according to an embodiment, is described herein below in relation to FIG. 5.

To continue, at step 103 the one or more clusters are mapped to existing CAD diagrams. In an embodiment, characteristics, such as spatial characteristics of the clusters, are used to map the clusters to respective existing CAD diagrams, such as 2D CAD diagrams and 3D CAD diagrams. Embodiments of the method 100 may use a variety of mapping techniques, including 3D to 3D, 3D to 2D, 3D to 2D to 3D, etc. To illustrate the mapping at step 103, consider the aforementioned example of the oil processing facility where one cluster of points represents a pump. In such an example, said cluster may be analyzed to determine, for instance, the dimensions of the cluster. These dimensions may then be used to identify an existing CAD diagram with the same or similar dimensions. The determination that a particular CAD diagram matches the cluster corresponding to the pump may then be stored, thus mapping the cluster to an existing CAD diagram.

As noted herein, point cloud data is unintelligent data. Thus, prior to the mapping at step 103 it is not known what type of object the clusters represent. The mapping at step 103 thus identifies the particular objects of the environment. An alternative embodiment of the method 100 stores an indication when a cluster cannot be mapped to an existing CAD diagram at step 103. This can highlight to a user, for instance, that a data cluster requires follow-up.

The existing CAD diagrams used in the mapping at step 103 may be any CAD diagrams known in the art, such as 2D CAD diagrams and 3D CAD diagrams. Further, in an alternative embodiment, the clusters are mapped to video data, photographic data, polygons, isometric diagrams, holograms, and flash data (i.e. interactive 2D and 3D images that contain identifying or known meta information that can be used to define or describe the graphical object). According to an embodiment of the method 100, the mapping at step 103 comprises flattening the one or more clusters to respective 2D representations and comparing the respective 2D representations to existing 2D CAD diagrams to identify one or more matching existing 2D CAD diagrams. Further still, an embodiment of the method 100 may utilize the principles described in the related matter "3D TO 2D REIMAGING FOR SEARCH" by Nelia Gloria Mazula, Ser. No. 14/984, 412 to perform the mapping at step 103. In yet another embodiment, the existing CAD diagrams may be stored in a database/library of CAD diagrams that is communicatively coupled to a computer system implementing the method 100.

After mapping the clusters to existing CAD diagrams at step 103, the method 100 automatically updates a CAD model of the environment at step 104 using the existing CAD diagrams. In such an embodiment, a CAD model of the environment exists, such as the CAD diagram that was developed upon constructing the environment. This CAD diagram is then updated at step 104 to reflect the environment as it currently exists. Very often complex facilities as built vary from the facility as designed and these variances are rarely captured in CAD. Further, environments such as oil processing facilities change over time, modifications are made, objects are replaced and moved and similarly, these changes too are not reflected in CAD. Thus, embodiments of the method 100 provide a method to automatically update a CAD model in such a scenario, amongst other examples. According to an embodiment, updating the CAD model of the environment at step 104 shows spatial and mechanical changes to the environment. Further, in yet another embodiment, the CAD diagram may be updated to include information on one or more materials of the objects in the environment.

Further, it is noted that embodiments of the method 100 are not limited to updating an existing CAD model. If no such model exists, the mapping performed at step 103 can, in turn, be used to generate a CAD model of the environment.

An embodiment of the method 100 further comprises iterating the identifying, mapping, and updating to update sub-components of the one or more clusters. In such an example embodiment, the clusters identified at step 102 can be further processed to identify sub-clusters of those clusters, where sub-clusters correspond to one or more sub-components of the original cluster. For instance, in the example where a cluster corresponding to a pump is identified, this cluster can be further processed to, for example, identify a sub-cluster that belongs to a handle of the pump. This sub-cluster can then be mapped to an existing CAD diagram and the CAD model can be appropriately updated in response to the mapping. In such an example, iterating the identifying, mapping, and updating can further improve the detail of the CAD model of the environment.

To illustrate, consider a first iteration where a cluster representing a pump is identified, the cluster is mapped to a 3D CAD diagram of a pump and the CAD diagram of the environment is appropriately updated using the mapped 3D CAD diagram of the pump. This cluster may be further processed to identify a cluster belonging to a sub-component of the pump, a handle, and this sub-cluster may be mapped to a handle CAD model that was different from the previously mapped CAD diagram of the pump. The CAD model of the environment can then be further updated to include the information on the handle as it exists in the environment.

Further, in yet another example embodiment, the iterating can be used in mapping objects and updating the CAD model when the mapping previously failed. Consider an example where, because of the point cloud quality, a cluster did not map to any existing CAD diagram and that portion was indicated as unknown. The method steps 102-104 can then be performed on the cluster to determine if any other information can be discerned. In such an example, a sub-cluster may be identified that belongs to a particular component, for example a valve stem that only functions with a particular valve. With this information, the original cluster can be mapped to a 3D CAD diagram of the valve. Embodiments of the present invention can utilize such logic or other relationships that can be discerned by one of skill in the art to fully update a CAD model.

As noted herein, embodiments of the present invention identify groupings, i.e. clusters, of a point cloud. According to an embodiment, these groupings can be based on spaces without objects, i.e., changes in density between groups of objects. In an embodiment, these clusters can then be named and libraries of groups of point clouds can be created. Logic can be created, for example, using computer program instructions, to identify more complex objects, e.g., groups of groups. Embodiments of the invention can also utilize artificial learning to re-engineer CAD diagrams through use of sound waves to generate point clouds that can be separated into objects. Groups of point clouds or sub-components of objects can be identified using methods described herein to define complex shapes. Artificial intelligence can be used to compile and define object libraries. Such methods can collect and define the objects of the libraries and can further identify additional objects based on the existing object libraries and publically available or created information. Embodiments can utilize analytics or machine learning logic such as artificial intelligence to implement the various embodiments described herein.

Figure 2:
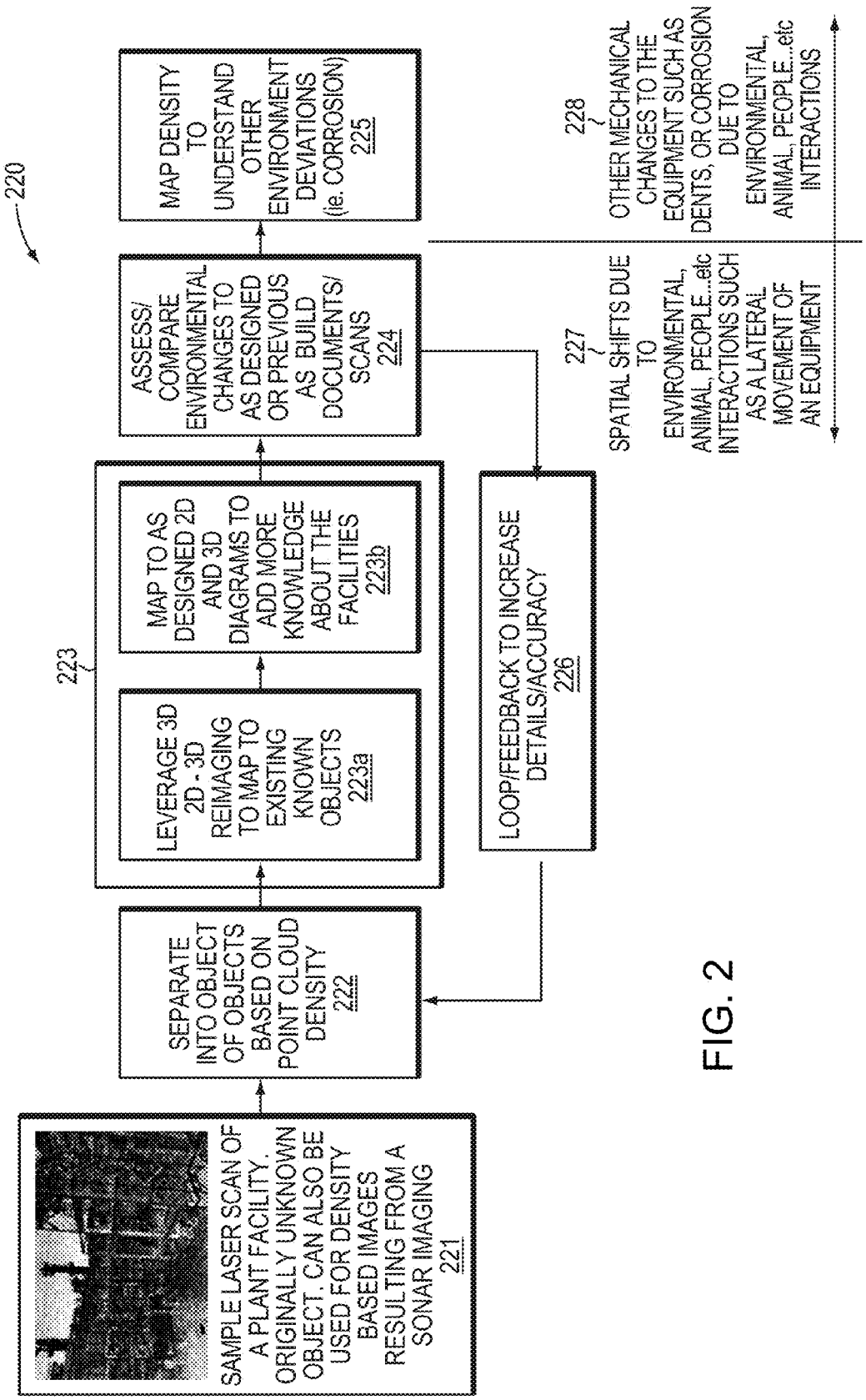
FIG. 2 is a process flow diagram of updating a CAD model using principles of embodiments of the invention.

FIG. 2 depicts a method 220 that can utilize principles of the present invention to attribute intelligence to data of an environment, for example, a chemical processing plant. The method 220 begins at step 221 by generating a point cloud representing an environment. In an embodiment, the point cloud is generated at step 221 by performing a laser scan of the environment or by using sonar as described herein. At step 222, the laser scan data is processed based upon point density to identify individual objects and sub-components of those objects. For example, a dense portion of the point cloud surrounded by a relatively low density of points may be considered a single object. The point cloud data pertaining to this single object can, in turn, be further processed to identify portions of that data with varying densities thereby identifying subcomponents of the object. Next, an identification process 223 is performed using the principles described herein, such as the method 440 described herein below in relation to FIG. 4. In an embodiment, at step 223*a* the point cloud data is flattened, compared to existing 2D data, and used to identify matching 2D data. At step 223*b* the matching data is used to update the point cloud data with more information, e.g., object type, object dimensions, object material, etc. The process 223*b* may update the point cloud data with any information about the object that can be discovered. Thus, when matching 2D data is found at step 223*a*, any existing matching data about any property of the object can be attributed to the point cloud data of the object at step 223*b*. Step 223*b* may further update a CAD model of the environment using the existing data identified at step 223*a*. Next, in an example of the method 220 where an original 3D model/data for the facility exists, the method 220, at step 224, assess and compares environmental changes to the as designed/built model. In other words, the now identified 3D data is compared to existing 3D data of the facility to identify distinctions between the existing data and the facility as it currently exists. Step 224 can for example, identify spatial shifts due to environmental, animal, or people interactions, such as lateral movement of equipment 227. The method 220 can further still, evaluate the density data of the now identified 3D data at step 225 to gain knowledge on other environmental/mechanical changes such as dents and corrosion 228.

The method 220 may further include a feedback process 226 to add further detail to the knowledge of the 3D data. While depicted in FIG. 2 as occurring from step 224, in embodiments, the feedback process 226 may be performed from step 223*a*, 223*b*, 224, and/or step 225. The important consideration being that the 3D data has been identified. Once the 3D data has been identified, this knowledge can be used to further inform the process 220. For example, if a particular portion of the point cloud has been identified as representing a valve at step 223*b*, it may then be known from the data library that the valve comprises a valve stem. This information can be used, for example at step 222, to further divide the point cloud data of the valve into two objects, a valve body and a valve stem. In an alternative embodiment, the feedback process 226 may occur when the mapping at step 223*a* fails.

Embodiments of the method 220 enable plant design tools, viewers, laser scan technologies, and other similar image based engineering tools to more expansively attribute intelligence to the plant laser scan, sonar, or similar non-intelligent images using more automation capabilities. Embodiments, thus, reduce the need for manual interference and can more accurately and more efficiently re-engineer 3D data. Embodiments solve the problem of keeping a model up to date, and thus, improve for example, facilities engineering decisions. Using existing methods, updates are performed in a modular way on a 2D or 3D solution without updating the original larger model. Laser scan, for instance, provides a way to collect up to date data on the facility, but the laser scan data is unintelligent data that does not provide a CAD model.

Embodiments of the present invention can be used in an iterative manner to identify as much detail as possible about the data, e.g., sonar data. Further, embodiments can be configured to identify particular objects of interest. For example, using an embodiment of the present invention, such as the method 220, one can identify all of the pumps in an environment. If for example the method 220 is performed to identify all of the pumps in an environment, it is likely that some of the 3D data will remain unidentified, where for example, the laser scan did not obtain ideal data for that object. However, the process for identification may also identify objects of the facility that form for example, pipelines, that would feed into a pump. With this knowledge, the 3D data can be re-processed, according to the principles described herein, to identify unknown objects as pumps using the pipeline data. Thus, the pipeline knowledge can be used to infer that the hard to read data must be a pump. With this knowledge, the re-processing can update the unknown data to be a pump.

The foregoing example provides just one illustration of advanced logic that can be utilized to identify objects from 3D data and further update a CAD model of an environment. Embodiments of the invention can be configured to use any such logic/decision making to inform the processing. Thus, embodiments can be programmed to use any identifying clues/information to help inform the identification processing implemented by the methods described herein.

Principles of embodiments of the present invention may be utilized to identify environmental changes between an as designed environment and the environment as it exists. Embodiments may identify spatial shifts, such as lateral movement of equipment, due to the environment, people, and animals. The density collection information may also be used to understand other environmental deviations, such as corrosion and dents, especially in sonar based scanning.

Existing methods do not provide a practical solution for reflecting modifications to a plan of an environment. Embodiments of the invention allow users to avoid re-engineering the entire point cloud into CAD. Further, embodiments can facilitate viewing several CAD models and interactive CAD models, or similar views such as smart videos rather than being limited to laser scan data. Embodiments of the present invention, such as the method 220 allow a user to keep a model up-to-date which improves facilities engineering.

Figure 3:
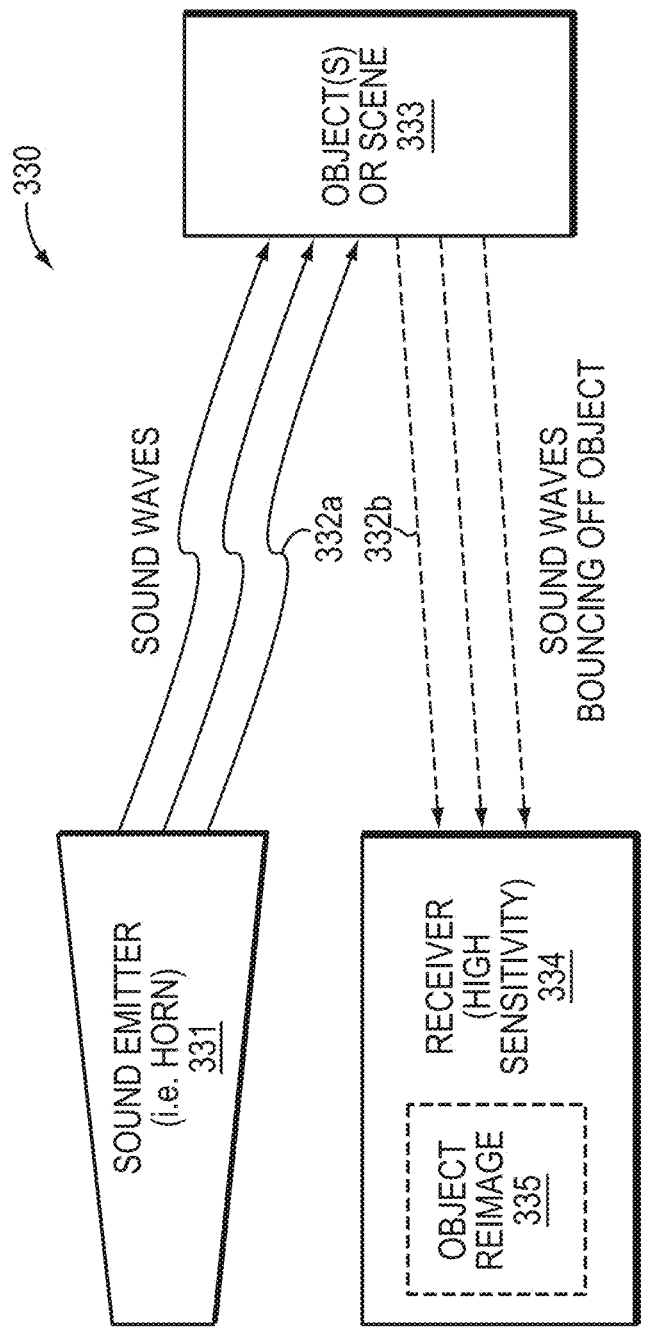
FIG. 3 depicts a system for obtaining and processing data to update a CAD model that may be used by embodiments.

Embodiments of the present invention may utilize any appropriate signal type in updating CAD models. For instance, embodiments may use sonar, i.e., sound in re-engineering/updating CAD models. FIG. 3 depicts a sonar-based system 330 for obtaining data that can be used to update a CAD model according to an embodiment. The system 330 includes a sound emitter 331 that is capable of emitting the sound waves 332a at the environment and/or object(s) 333. The sounds waves 332a reflect off the object (s) 333 as the sounds waves 332b and are received at the high sensitivity receiver 334. The receiver 334 in turn formulates the 3D data 335 (e.g., a point cloud or one or more images) based on the received signals 332b. In an alternative embodiment of the system 330, the receiver provides the received signals 332b to a further processing device (not shown) to formulate the point cloud (object re-image) 335.

For hard to access environments, the sonar hardware (emitter 331 and receiver 334) are used to recreate images 335 similarly to performing a laser scan. The sounds waves 332a and 332b are used to capture visual images and recreate digital images of the environment 333. High sensitivity receivers, such as the receiver 334, provide high quality point clouds which capture a significant amount of information on density collections and space of the environment/objects 333.

In an example use of the system 330, the sound waves 332a are emitted from the emitter 331 as a projectile at the scene 333. The sound waves 332b reflect off the scene 333 and are captured by the receiver 334 and used to create a point cloud 335 of the scene 333. Using a high sensitivity receiver 334 allows the system 330 to identify changes in density resulting from the sounds waves 332b reflecting off varying materials as well as capture small spaces between objects. These changes in density and varying densities can then be used to determine the objects in the environment and the locations thereof as described herein.

Figure 4:
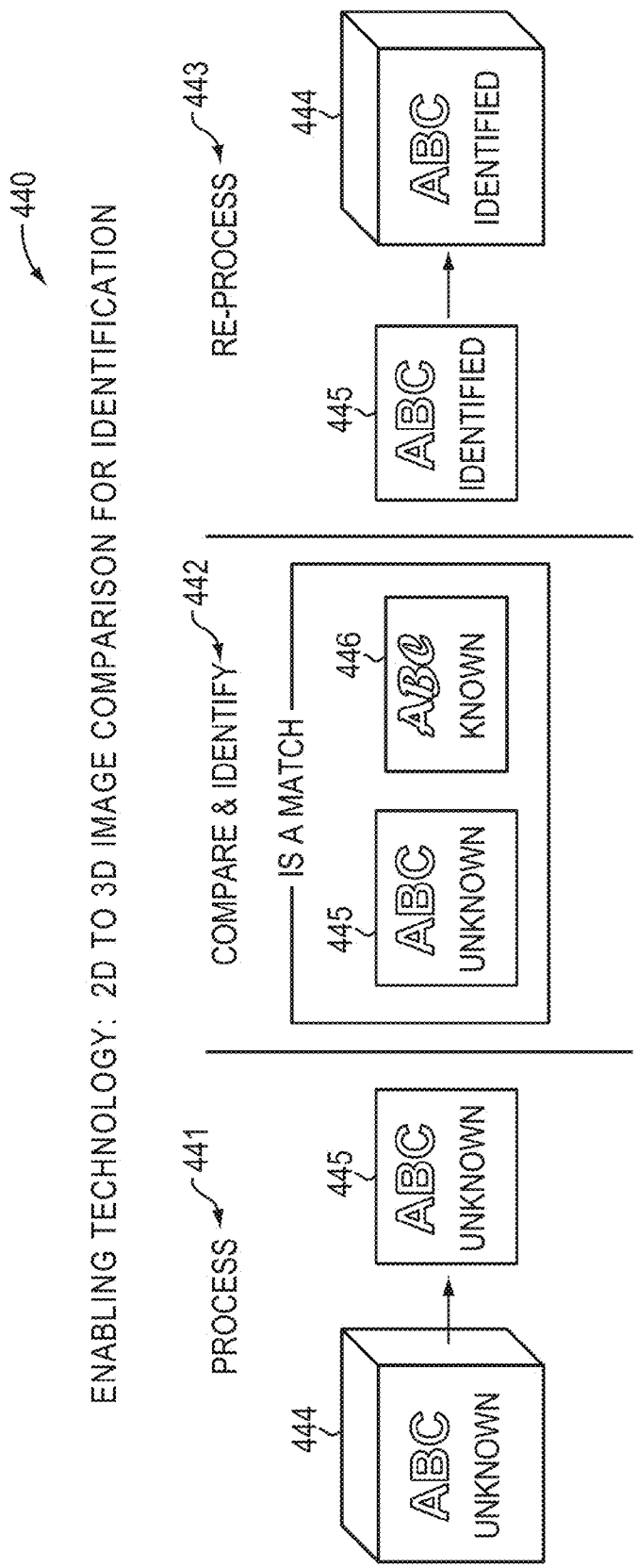
FIG. 4 illustrates a process flow of comparing data that may be used in an example embodiment.

FIG. 4 depicts a method 440 of identifying an object from 3D data of an object using principles of the present invention. The method 440 begins with the flattening process 441 where the unidentified 3D data 444 is flattened to produce the 2D data 445. The flattening process 441 may be performed by taking a snapshot of a single view of the 3D data 444 and/or by removing data from the 3D data 444 such that the remaining data only pertains to a 2D portion of the original 3D data 444. A comparison and identification step 442 continues the method 440. In the comparison and identification process 442, the unidentified 2D data 445 is compared to known 2D data to find matching 2D data 446. This comparison process 442 may utilize a library and/or plurality of libraries, of 2D or photo image data. Further, in an embodiment, the unknown 2D data and library of 2D data are compared using common equidistance points. In such an embodiment, matching data, such as the 2D data 446 is identified where the unknown data 445 and matching data 446 have similar or the same equidistance points. When the comparison and identifying process 442 identifies the matching 2D data 446, the unknown 2D data 445 is now identified. The now identified 2D data 445 can then be used in the re-process step 443 to update the 3D data 444 that was previously unidentified.

Figure 5:
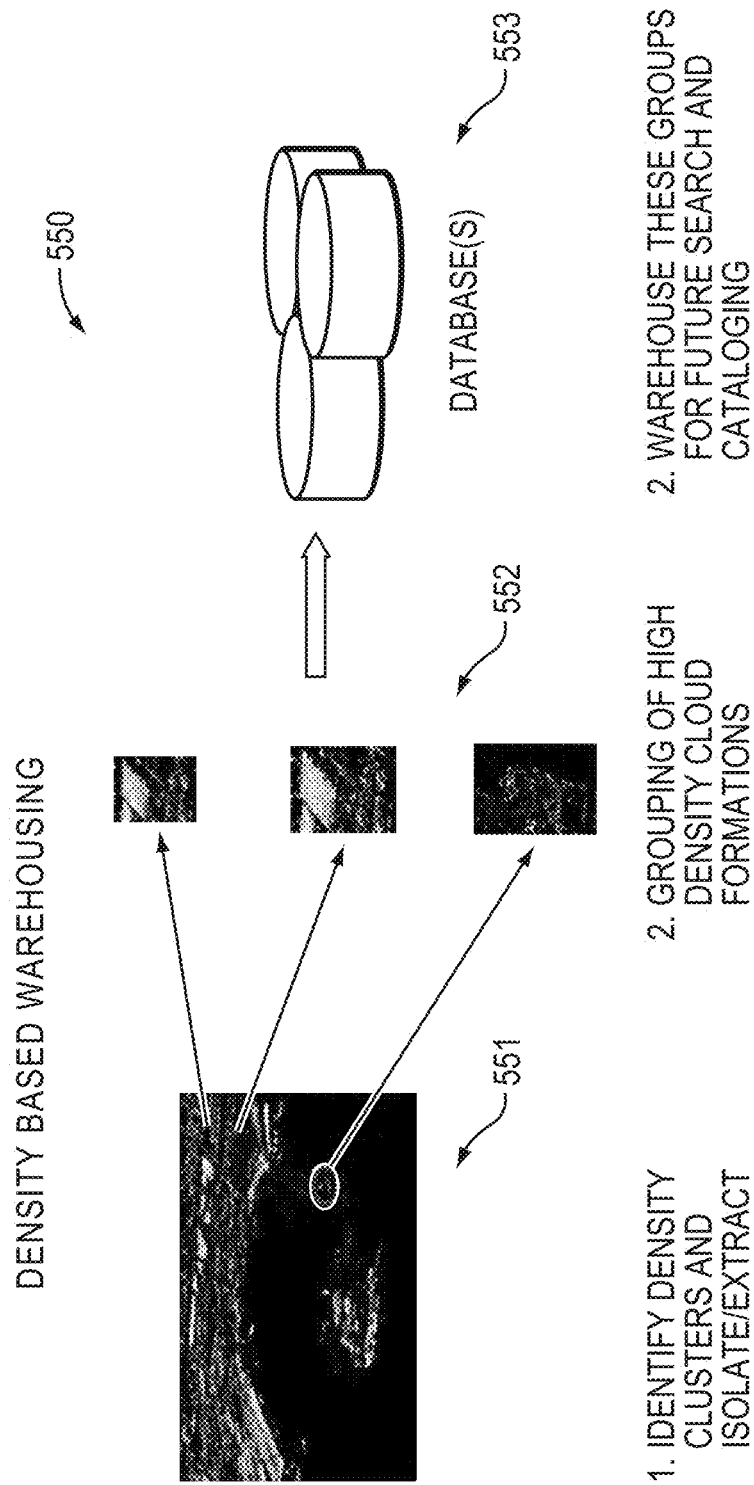
FIG. 5 depicts a method of data storage that may be implemented using principles of the present invention.

FIG. 5 illustrates a process 550 of identifying and storing clusters, i.e. point cloud groupings, according to an embodiment. The process 550 begins with a point cloud and at step 551 identifies clusters based on the density of points comprising the clusters and these clusters are in turn extracted to form isolated clusters. In an embodiment of the process 550, the point cloud groupings are identified at step 551 based on changes in density collections between objects. The process 550 continues and at step 552 groups of the clusters are formed. These groups can for instance be based upon point density where clusters with like densities are grouped. Further, these groups can be named and/or libraries of the groups and clusters comprising the groups can be created. In an embodiment, the groups and clusters are then stored in one or more databases at step 553 for further processing as described herein.

An alternative embodiment of the process 550 utilizes an appropriately configured computer program product to identify complex objects of the clusters identified at step 551. Such and embodiment of the process 550 can use artificial learning to compile and define the various libraries of clusters than can be created. Further, embodiments can leverage additional logic to collect and define the object libraries and can further learn new objects based upon the existing object libraries.

Figure 6:
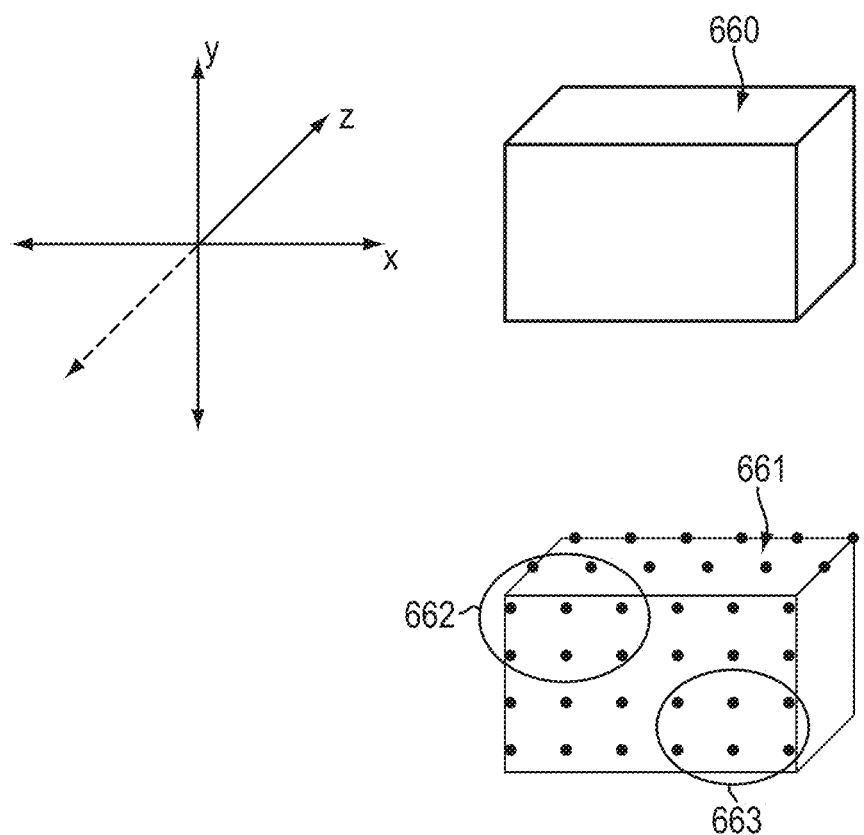
FIG. 6 illustrates density variations in a point cloud that may be utilized in embodiments of the present invention.

FIG. 6 illustrates density variations, i.e., density collections/clusters, that may be used in an embodiment to group objects for mapping or that can be utilized to distinguish between different objects in the point cloud. In an embodiment, the object 660 is scanned as described herein, to form the point cloud 661. In the point cloud 661, it can be seen that the cluster of points 662, which in this case is on multiple edges, has a larger number of points when viewed on a 2D viewer, e.g., computer, than the collection of points 663 which is a view of points on a flat surface. While the cluster with a larger number of points 662 occurs on edges of the point cloud 661, clusters occurring on folds or other similar changes in a point cloud would similarly contain a larger number of points. In an embodiment of the present invention, density deviations are used to identify a group of points which may correspond to an object or a component of an object. Similarly, density deviations can be used to distinguish between two different objects.

Figure 7:
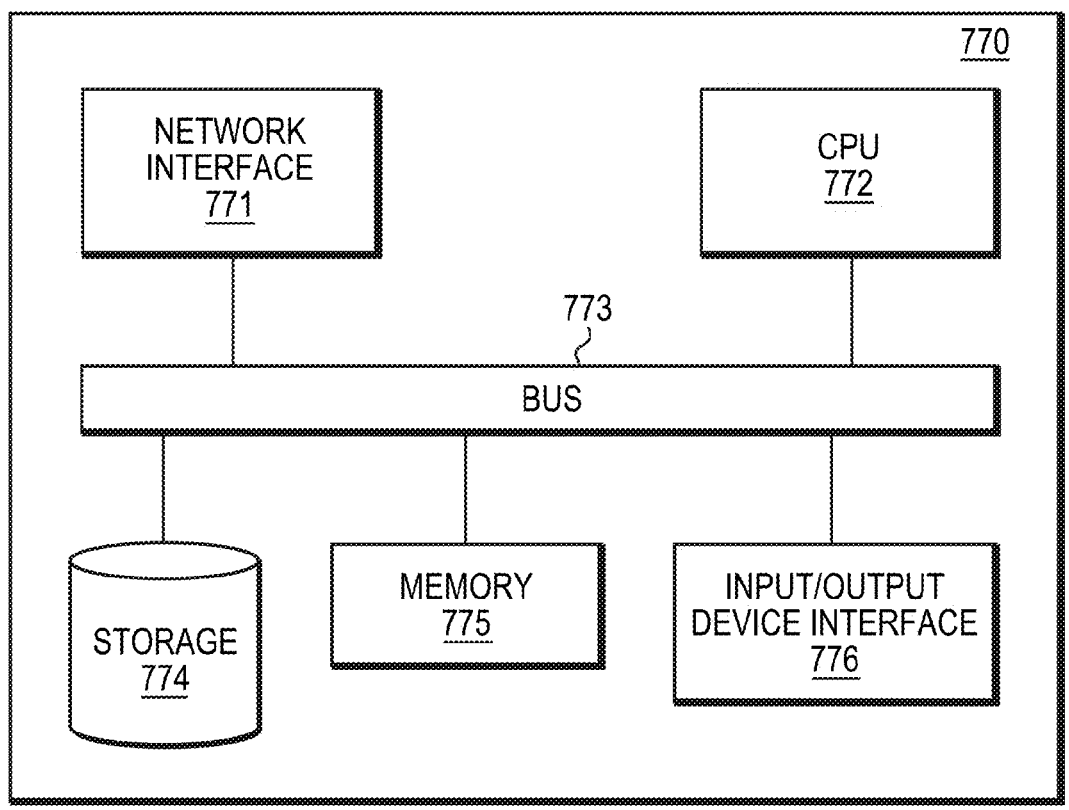
FIG. 7 is a simplified block diagram of a computer system for updating a CAD model according to an embodiment.

FIG. 7 is a simplified block diagram of a computer-based system 770 that may be used to update a CAD model representing an environment according to an embodiment of the present invention. The system 770 comprises a bus 773. The bus 773 serves as an interconnect between the various components of the system 770. Connected to the bus 773 is an input/output device interface 776 for connecting various input and output devices such as a keyboard, mouse, display, speakers, etc. to the system 770. A central processing unit (CPU) 772 is connected to the bus 773 and provides for the execution of computer instructions. Memory 775 provides volatile storage for data used for carrying out computer instructions. Storage 774 provides non-volatile storage for software instructions, such as an operating system (not shown). The system 770 also comprises a network interface 771 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 770, or a computer network environment such as the computer environment 880, described herein below in relation to FIG. 8. The computer system 770 may be transformed into the machines that execute the methods (e.g. 100 and 220) described herein, for example, by loading software instructions into either memory 775 or non-volatile storage 774 for execution by the CPU 772. One of ordinary skill in the art should further understand that the system 770 and its various components may be configured to carry out any embodiments of the present invention described herein. Further, the system 770 may implement the various embodiments described herein utilizing any combination of hardware, software, and firmware modules operatively coupled, internally, or externally, to the system 770.

Figure 8:
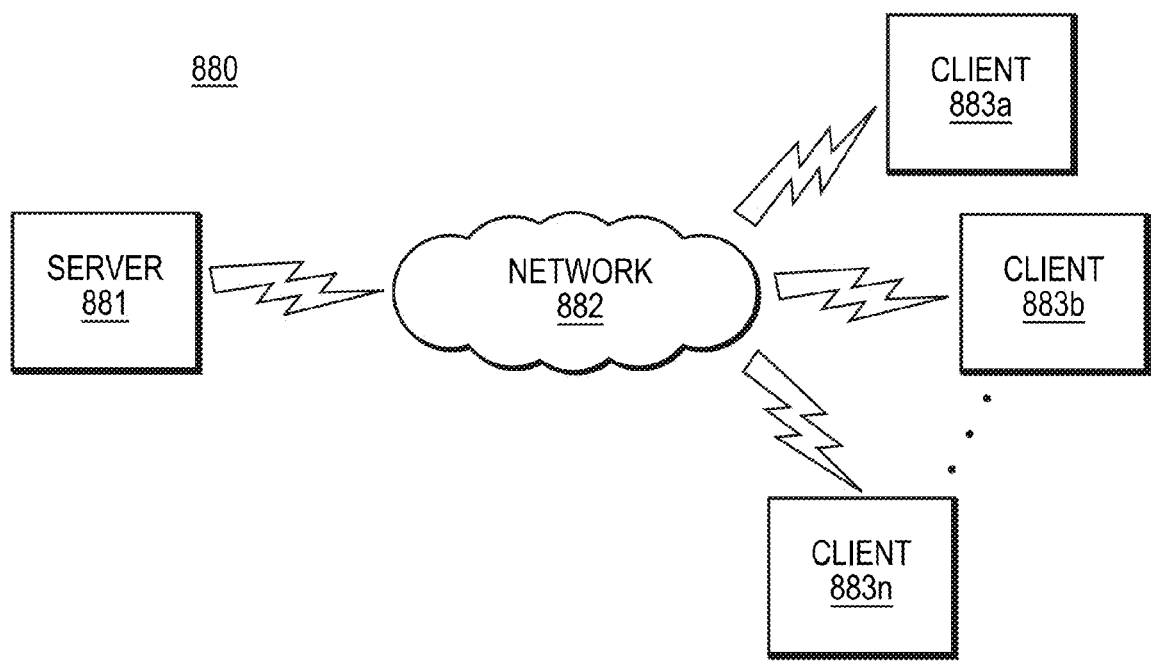
FIG. 8 is a simplified diagram of a computer network environment in which an embodiment of the present invention may be implemented.

FIG. 8 illustrates a computer network environment 880 in which an embodiment of the present invention may be implemented. In the computer network environment 880, the server 881 is linked through the communications network 882 to the clients 883a-n. The environment 880 may be used to allow the clients 883a-n, alone or in combination with the server 881, to execute any of the methods (e.g., 100) described herein.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained here are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method of updating a computer aided design (CAD) model representing an environment, the method comprising:
   based on received signals, the received signals having reflected off one or more real-world objects of an environment, generating in computer memory a point cloud representing the one or more objects of the environment;
   identifying one or more clusters of the point cloud based on changes from low point density to higher point density of points that include the one or more clusters, said changes from low point density to higher point density indicating at least one of a fold, a corner, or an edge of a given cluster and said identifying being performed by a processor coupled to the computer memory;
   mapping, by the processor, the one or more clusters to existing CAD diagrams; and
   automatically updating, by the processor, a CAD model of the environment using the existing CAD diagrams mapped to the one or more clusters, the CAD model of the environment being held in a computer system memory.

2. The method of claim 1 further comprising:
   iterating the identifying, mapping, and updating to update sub-components of the one or more clusters.

3. The method of claim 1 further comprising:
   storing the identified one or more clusters as respective libraries in the computer memory.

4. The method of claim 1 wherein mapping the one or more clusters comprises:
   flattening the one or more clusters to respective two-dimensional (2D) representations; and
   comparing the respective 2D representations to existing 2D CAD diagrams to identify one or more matching existing 2D CAD diagrams.

5. The method of claim 1 wherein the received signals are at least one of:
   sound signals; and
   light signals.

6. The method of claim 1 further comprising:
updating the CAD model of the environment to show spatial changes of the one or more real-world objects using the point cloud.

7. The method of claim 1 further comprising:
updating the CAD model of the environment to show mechanical changes to the one or more real-world objects using the point cloud.

8. The method of claim 1 further comprising:
identifying one or more materials of the one or more real-world objects using the point cloud.

9. A system for updating a computer aided design (CAD) model representing an environment, the system comprising:
an emitter configured to emit a signal at one or more objects of an environment;
a receiver configured to receive signals reflecting off the one or more objects;
a digital processing module communicatively coupled to the receiver and comprising a computer memory and a processor communicatively coupled to the computer memory, the processor configured to:
generate in the computer memory a point cloud representing the one or more objects of the environment using the received signals;
identify one or more clusters of the point cloud based on changes from low point density to higher point density of points that include the one or more clusters, said changes from low point density to higher point density indicating at least one of a fold, a corner, or an edge of a given cluster;
map the one or more clusters to existing CAD diagrams; and
automatically update a CAD model of the environment using the existing CAD diagrams mapped to the one or more clusters, the CAD model of the environment being held in the computer memory.

10. The system of claim 9 wherein the digital processing module processor is further configured to:
iterate the identifying, mapping, and updating to update sub-components of the one or more clusters.

11. The system of claim 9 further comprising:
a database configured to store the identified one or more clusters as respective libraries in the computer memory.

12. The system of claim 9 wherein the digital processing module processor is configured to map the one or more clusters by:
flattening the one or more clusters to respective two-dimensional (2D) representations; and
comparing the respective 2D representations to existing 2D CAD diagrams to identify one or more matching existing 2D CAD diagrams.

13. The system of claim 9 wherein the emitter emits at least one of:
sound signals; and
light signals.

14. The system of claim 9 wherein the digital processing module processor is further configured to:
update the CAD model of the environment to show spatial changes of the one or more real-world objects using the point cloud.

15. The system of claim 9 wherein the digital processing module processor is further configured to:
update the CAD model of the environment to show mechanical changes of the one or more real-world objects using the point cloud.

16. The system of claim 9 wherein the digital processing module processor is further configured to:
identify one or more materials of the one or more real-world objects using the point cloud.

17. A computer program product for updating a computer aided design (CAD) model representing an environment, the computer program product executed by a server in communication across a network with one or more clients and comprising:
a non-transitory computer readable medium, the computer readable medium comprising program instructions which, when executed by one or more processors causes the one or more processors to:
based on received signals, the received signals having reflected off one or more real-world objects of an environment, generate, in computer memory coupled to the processor, a point cloud representing the one or more objects of the environment;
identify one or more clusters of the point cloud based upon changes from low point density to higher point density of points comprising the one or more clusters, said changes from low point density to higher point density indicating at least one of a fold, a corner, or an edge of a given cluster;
map the one or more clusters to existing CAD diagrams; and
automatically update a CAD model of the environment using the existing CAD diagrams mapped to the one or more clusters, the CAD model of the environment being held in the computer memory.

18. The computer program product of claim 17 wherein the program instructions further cause the one or more processors to:
iterate the identifying, mapping, and updating to update sub-components of the one or more clusters.

19. The computer program product of claim 17 wherein the program instructions further cause the one or more processors to:
store the identified one or more clusters as respective libraries in the computer memory.

20. The computer program product of claim 17 wherein the program instructions cause the one or more processors to map the one or more clusters by:
flattening the one or more clusters to respective two-dimensional (2D) representations; and
comparing the respective 2D representations to existing 2D CAD diagrams to identify one or more matching existing 2D CAD diagrams.

* * * * *